(12) United States Patent
Perreault et al.

(10) Patent No.: US 10,840,805 B2
(45) Date of Patent: *Nov. 17, 2020

(54) INTEGRATED POWER SUPPLY AND MODULATOR FOR RADIO FREQUENCY POWER AMPLIFIERS

(71) Applicant: Eta Devices, Inc., Cambridge, MA (US)

(72) Inventors: David J. Perreault, Brookline, MA (US); Wei Li, Monterey, CA (US); Yevgeniy A. Tkachenko, Belmont, MA (US)

(73) Assignee: Eta Devices, Inc.

( * ) Notice: Subject to any disclaimer, the term of this patent is extended or adjusted under 35 U.S.C. 154(b) by 282 days.

This patent is subject to a terminal disclaimer.

(21) Appl. No.: 14/035,445

(22) Filed: Sep. 24, 2013

(65) Prior Publication Data

US 2015/0084701 A1 Mar. 26, 2015

(51) Int. Cl.
*H02M 3/158* (2006.01)
*H03F 3/193* (2006.01)
(Continued)

(52) U.S. Cl.
CPC ............ *H02M 3/158* (2013.01); *H02M 3/07* (2013.01); *H03F 1/0227* (2013.01); *H03F 3/005* (2013.01);
(Continued)

(58) Field of Classification Search
CPC ........ H02M 7/10; H02M 7/103; H02M 7/106; H02M 3/156; H02M 3/158; H02M 3/1582; H02M 3/1584; H02M 3/1586; H02M 3/07; H02M 3/071; H02M 3/072; H02M 3/073; H02M 2003/075; H02M 2003/076;
(Continued)

(56) References Cited

U.S. PATENT DOCUMENTS 5,481,447 A 1/1996 Canis et al.
5,491,623 A 2/1996 Jansen
(Continued)

FOREIGN PATENT DOCUMENTS

CN 101 453 162 A 6/2006
CN 101 521 458 A 9/2009
(Continued)

OTHER PUBLICATIONS

Choi, et al.; "A ΔΣ-Digitized Polar RF Transmitter," IEEE Transactions on Microwave Theory and Techniques, vol. 55; No. 12; Dec. 2007; pp. 2679-2690.
(Continued)

*Primary Examiner* — Thienvu V Tran
*Assistant Examiner* — Carlos O Rivera-Perez
(74) *Attorney, Agent, or Firm* — Daly, Crowley, Mofford & Durkee LLP

(57) ABSTRACT

An integrated power supply and modulator system includes integrated power supply and modulator system includes three subsystems: a switched-capacitor voltage balancer stage; a magnetic regulation stage; and at least one output switching stage. In one embodiment, the integrated power supply and modulator system further includes startup circuitry, feedback/feedforward circuitry and control circuitry.

28 Claims, 13 Drawing Sheets

(51) Int. Cl.
  *H03F 1/02* (2006.01)
  *H03F 3/00* (2006.01)
  *H03F 3/217* (2006.01)
  *H02M 3/07* (2006.01)
(52) U.S. Cl.
  CPC ........... *H03F 3/193* (2013.01); *H03F 3/2178* (2013.01); *H03F 2200/102* (2013.01); *H03F 2200/451* (2013.01)
(58) Field of Classification Search
  CPC ..... H02M 2003/077; H02M 2003/078; H02M 3/06; H02M 3/16; H02M 3/18; H02M 2003/071; H02M 2003/072; H02M 2003/156; H02M 2003/1552; H02M 2001/0067; H02M 2001/007; H02M 2001/0074; H02M 2001/0077; H02M 2001/008; H02M 2003/1557; H02M 2003/1586; H02M 2001/0064; H02M 3/02; H02M 3/04; H02M 3/10; H02M 3/145; H02M 3/155; H02M 3/1588; H03F 1/0227; H03F 1/0222; H03F 3/189; H03F 3/19; H03F 3/195; H03F 3/193; H03F 2200/102; H03F 2200/451; H03F 3/21; H03F 3/2171; H03G 3/3042; H03G 3/3036; H04B 1/0483
  USPC ........ 323/205–211, 222–226, 282–288, 311, 323/312, 351, 901, 266–275, 290, 323/299–303; 363/44–47, 59–63, 65, 363/147, 15–17, 21.02, 21.03, 123–127; 330/124, 127, 199, 297, 125, 126; 320/121, 166, 107, 116–123, 108, 167; 307/109, 110, 77; 327/534–537; 257/299, 298; 341/172
  See application file for complete search history.

(56) References Cited

U.S. PATENT DOCUMENTS

| | | |
|---|---|---|
| 7,103,114 B1 | 9/2006 | Lapierre |
| 7,482,869 B2 | 1/2009 | Wilson |
| 7,535,133 B2 | 5/2009 | Perreault et al. |
| 7,589,605 B2 | 9/2009 | Perreault et al. |
| 7,786,712 B2 | 8/2010 | Williams |
| 7,889,519 B2 | 2/2011 | Perreault et al. |
| 8,026,763 B2 | 9/2011 | Dawson et al. |
| 8,164,384 B2 | 4/2012 | Dawson et al. |
| 8,212,541 B2 | 7/2012 | Perreault et al. |
| 8,451,053 B2 | 5/2013 | Perreault et al. |
| 8,503,203 B1* | 8/2013 | Szczeszynski et al. ........ 363/60 |
| 8,718,188 B2 | 5/2014 | Balteanu et al. |
| 2005/0194951 A1* | 9/2005 | Mehas .................... H02M 1/36 323/282 |
| 2008/0003960 A1 | 1/2008 | Zolfaghari |
| 2008/0019459 A1 | 1/2008 | Chen et al. |
| 2008/0157733 A1* | 7/2008 | Williams ................ H02M 3/07 323/266 |
| 2009/0033293 A1* | 2/2009 | Xing et al. .................... 320/164 |
| 2009/0322384 A1 | 12/2009 | Oraw et al. |
| 2009/0332414 | 12/2009 | Oraw et al. |
| 2010/0073084 A1 | 3/2010 | Hur et al. |
| 2010/0117727 A1* | 5/2010 | Dawson et al. .......... 330/124 R |
| 2012/0075023 A1* | 3/2012 | Guo ..................... H03F 1/0261 330/296 |
| 2012/0176195 A1 | 7/2012 | Dawson et al. |
| 2012/0200163 A1* | 8/2012 | Ito ..................... H01M 10/441 307/77 |
| 2012/0313602 A1 | 12/2012 | Perreault et al. |
| 2012/0326684 A1 | 12/2012 | Perreault et al. |
| 2013/0021827 A1* | 1/2013 | Ye .................. H03F 1/025 363/17 |
| 2013/0187612 A1 | 7/2013 | Aiura |
| 2013/0029841 A1 | 9/2013 | Guiliano |
| 2013/0229841 A1* | 9/2013 | Guiliano ........................ 363/60 |
| 2013/0241625 A1 | 9/2013 | Perreault et al. |
| 2013/0251066 A1 | 9/2013 | Kim et al. |
| 2013/0343106 A1 | 12/2013 | Perreault et al. |
| 2013/0343107 A1 | 12/2013 | Perreault |
| 2014/0118063 A1 | 5/2014 | Briffa et al. |
| 2014/0118065 A1 | 5/2014 | Briffa et al. |
| 2014/0118072 A1 | 5/2014 | Briffa et al. |
| 2014/0120854 A1 | 5/2014 | Briffa et al. |
| 2014/0125412 A1 | 5/2014 | Dawson et al. |
| 2014/0132354 A1 | 5/2014 | Briffa et al. |
| 2014/0167513 A1 | 6/2014 | Chang et al. |
| 2014/0226378 A1 | 8/2014 | Perreault |
| 2014/0306648 A1 | 10/2014 | Le et al. |
| 2014/0306673 A1* | 10/2014 | Le ........................ H02M 3/156 323/266 |
| 2015/0155895 A1* | 6/2015 | Perreault et al. ......... 330/124 R |

FOREIGN PATENT DOCUMENTS

| | | | |
|---|---|---|---|
| WO | WO 2005/106613 A1 | 11/2005 | |
| WO | WO 2006/119362 A2 | 11/2006 | |
| WO | WO 2007/082090 A2 | 7/2007 | |
| WO | WO 2007/094921 A1 | 8/2007 | |
| WO | WO 2010/056646 A1 | 5/2010 | |
| WO | WO 2010/081843 A2 | 7/2010 | |
| WO | WO 2011/097387 A1 | 8/2011 | |
| WO | WO 2012/151466 A2 | 11/2012 | |
| WO | WO 2013/086445 A1 | 6/2013 | |
| WO | WO 2013086445 A1 * | 6/2013 | ......... H05B 33/0815 |
| WO | WO 2013/109719 A1 | 7/2013 | |
| WO | WO 2013/109743 A2 | 7/2013 | |
| WO | WO 2013/109797 A1 | 7/2013 | |
| WO | WO 2013/134573 A1 | 9/2013 | |
| WO | WO 2013/191757 A1 | 12/2013 | |
| WO | WO 2014/004241 A2 | 1/2014 | |
| WO | WO 2014/028441 A2 | 2/2014 | |
| WO | WO 2014/070474 | 5/2014 | |
| WO | WO 2014/070475 | 5/2014 | |
| WO | WO 2014/070998 | 5/2014 | |
| WO | WO 2014/085097 | 6/2014 | |

OTHER PUBLICATIONS

Gody, et al.; "A 2.4-GHz, 27-dBm Asymmetric Multilevel Outphasing Power Amplifier in 65-nm CMOS;" IEEE Journal of Solid-State Circuits; vol. 47; No. 10; Oct. 2012; pp. 2372-2384.

Pilawa-Podgurski, et al.; "Merged Two-Stage Power Converter with Soft Charging Switched-Capacitor Stage in 180 nm CMOS;" IEEE Journal of Solid-State Circuits; vol. 47; No. 7; Jul. 2012; pp. 1557-1567.

Rabb; "Average Efficiency of Class-G Power Amplifiers;" IEEE Transactions on Consumer Electronics; Vo. CE-32; No. 2, May 1986; pp. 145-150.

Seeman, et al.; "Analysis and Optimization of Switched Capacitor DC-DC Converters;" IEEE Transactions on Power Electronics; vol. 23; No. 2; Mar. 2008; pp. 841-851.

Vasic, et al.; "Comparison of Two Multilevel Architectures for Envelope Amplifier;" IEEE Industrial Electronics Conference; Jan. 2009; pp. 283-289.

Vasic, et al.; "Multilevel Power Supply for High Efficiency RF Amplifiers;" IEEE Amplifiers Power Electronics Conference; Feb. 2009; pp. 1233-1238.

Walling, et al.; "A Class-G Supply Modulator and Class-E PA in 130 nm CMOS;" IEEE Journal of Solid-State Circuits; vol. 44; No. 9; Sep. 2009; pp. 2339-2347.

Briffa, et al.; "Transmitter Architecture and Related Methods;" Patent Application filed Oct. 30, 2012; U.S. Appl. No. 13/663,878.

Briffa, et al.; "RF Amplifier Architecture and Related Techniques;" Patent Application filed Oct. 30, 2012; U.S. Appl. No. 13/663,887.

Ahsanuzzaman, et al.; "A Low-Volume Power Management Module for Portable Applications Based on a Multi-Output Switched-

(56) References Cited

OTHER PUBLICATIONS

Capacitor Circuit;" Applied Power Electronics Conference and Exposition (APEC); 2013 Twenty-Eighth Annual IEEE; Mar. 17-21, 2013; pp. 1473-1479.
U.S. Appl. No. 14/619,737, filed Feb. 11, 2015, Perreault, et al.
Chang, et al.; "Multistage multiphase switched-capacitor DC-DC converter with variable-phase and PWM control;" International Journal of Circuit Theory and Applications; Int. J. Circ. Theor. Appl. 2002, 40:835-857; Published online Mar. 2, 2011 in Wiley Online Library.
PCT Search Report of the ISA for PCT/US2015/15372 dated May 20, 2015.
PCT Written Opinion of the ISA for PCT/US2015/15372 dated May 20, 2015.
U.S. Appl. No. 14/758,033, filed Jun. 26, 2015, Perreault, et al.
U.S. Appl. No. 14/791,685, filed Jul. 6, 2015, Perreault, et al.
U.S. Appl. No. 14/338,671, filed Jul. 23, 2014, Briffa, et al.
U.S. Appl. No. 14/934,760, filed Nov. 6, 2015, Briffa, et al.
U.S. Appl. No. 14/920,031, filed Oct. 22, 2015, Briffa, et al.
U.S. Appl. No. 14/837,616, filed Aug. 27, 2015, Briffa, et al.
U.S. Appl. No. 14/823,220, filed Aug. 11, 2015, Barton, et al.
U.S. Appl. No. 14/968,045, filed Dec. 14, 2015, Perreault et al.
U.S. Appl. No. 14/974,563, filed Dec. 18, 2015, Perreault et al.
U.S. Appl. No. 14/975,742, filed Dec. 19, 2015, Perreault et al.
U.S. Appl. No. 15/149,491, filed May 9, 2016, Perreault, et al.
Non-Final Office Action dated Aug. 3, 2016; for U.S. Appl. No. 14/619,737; 41 pages.
U.S. Appl. No. 15/290,402, filed Oct. 11, 2016, Perreault, et al.
U.S. Appl. No. 15/287,068, filed Oct. 6, 2016, Briffa, et al.
U.S. Appl. No. 15/354,170, filed Nov. 17, 2016, Briffa, et al.
Final Office Action dated Dec. 23, 2016 from U.S. Appl. No. 14/619,737; 25 Pages.
EPO Extended Search Report dated Sep. 13, 2017 from Application No. 15748815.6; 7 Pages.
Response to Final Office Action dated Dec. 23, 2016 as filed on Jun. 20, 2017; 19 Pages.
Notice of Allowance dated Jul. 19, 2017 from U.S. Appl. No. 14/619,737; 23 Pages.
European Examination Report dated Jul. 23, 2018 for European Application No. 15748815.6; 5 pages.
Response to European Extended Search Report as filed with the EPO on Mar. 26, 2018 for EP Appl. No. 15748815.6; 25 pages.
Response (with Amended Claims) to European Office Action dated Jul. 23, 2018 for European Application No. EP15748815.6; Response filed on Jan. 22, 2019; 17 Pages.
European Examination Report dated May 7, 2019 for European Application No. 15748815.6; 4 pages.
Response to Exam Report dated Oct. 16, 2019 for European Application No. 15748815.6; 4 pages.

* cited by examiner

INTEGRATED POWER SUPPLY AND MODULATOR FOR RADIO FREQUENCY POWER AMPLIFIERS

BACKGROUND

As is known in the art, efficiency improvement of radio frequency (RF) systems which employ one or more power amplifiers (PAs) can be achieved through supply (e.g. drain or collector) modulation, in which a voltage applied to the one or more PAs is dynamically changed according to characteristics of an RF signal being generated. A drain voltage can be changed on a time scale that is slow compared to amplitude variations of the RF signal (e.g., "adaptive bias"), or can be changed on a time scale in accordance with rapid variations of the RF signal amplitude (e.g., as is done in envelope tracking, polar modulation, "class G" power amplification, multilevel backoff, multilevel linear amplification with nonlinear components (LINC), Asymmetric Multilevel Outphasing (AMO), etc.).

Some systems providing drain modulation dynamically select an intermediate voltage from a set of discrete voltage levels, and then provide further regulation to synthesize a continuously variable drain voltage (e.g., for partially realizing a desired envelope in the output, e.g., "envelope tracking"). Other systems directly switch the drain voltage among discrete voltage levels. Such systems include "class G" amplifiers, multi-level LINC (MLINC) power amplifiers, asymmetric multilevel outphasing (AMO) power amplifiers, and multilevel backoff amplifiers (including "asymmetric multilevel backoff" amplifiers) and digitized polar transmitters.

In each of the systems above, two important functions are: 1) providing means to create multiple supply levels from a single supply input, possibly including regulation of the multiple discrete supply voltages; and 2) providing means to rapidly and efficiently switch among the discrete supply voltages. These two tasks can be performed separately, or—in some cases—together. The first task is sometimes accomplished using a multi-output power converter to synthesize multiple supply levels from a single input, and then using a switching network to select from among them. Multiple levels can be realized using a variety of techniques such as through multi-output magnetic converters, and/or through the multi-output switched-capacitor converters, and use of a plurality of converters. The second function is sometimes provided by selecting from among the set of discrete voltage levels via a switching network. These two functions can be performed together in a single structure, such as through use of a reconfigurable switched-capacitor voltage modulator.

SUMMARY

In accordance with the concepts sought be protected, described herein are systems, circuits and techniques for realizing a high-frequency voltage modulation system.

In one embodiment, an integrated power supply and modulator system includes a switched-capacitor (SC) voltage balancer stage coupled between a magnetic regulation stage and at least one output switching stage. With this particular arrangement, an integrated power supply and modulator system utilizes both magnetic and capacitive energy transfer in a cooperative manner to achieve both regulation and high efficiency operation. Alternative operating modes are possible in which regulation of the supply voltages is not sought, with energy transferred among levels through capacitive energy transfer only; such a mode can provide still higher efficiency, giving up to an extent the ability to efficiently regulate the voltages. Energy is provided into the integrated power supply and regulation system via the magnetic regulation stage and voltage signals having desired levels are delivered to one or more power amplifiers via the at least one output switching stages. In operation, energy coupled from an input to the magnetic regulation stage is used to generate a plurality of intermediate voltage levels having ratiometrically-related voltage levels at the outputs of the switched capacitor voltage balancer stage. The switched-capacitor voltage balancer stage (which may be more generally referred to as a multi-output switched-capacitor voltage converter) functions to regulate relative voltages on a set of capacitors, such that the capacitor voltages with respect to a common potential maintain a desired ratiometric relationship. These voltages represent, for example, a set of discrete supply voltages utilized for supply switching. The at least one output switching stage is coupled to rapidly select among these ratiometrically-related voltage levels and supply at least one output voltage. The output can be selected directly as one of these voltages, or additional filtering or other processing can be performed to provide a continuously-variable output voltage signal. Thus, the magnetic stage regulates the voltage, while the SC voltage balancer stage maintains the voltage ratios.

With this particular arrangement, a circuits and techniques suitable for operating from a variable dc input voltage are provided. Furthermore, where desired, this approach can be used regulate the plurality of intermediate voltage values. Furthermore, the circuits and techniques described herein are suitable for implementing a semiconductor circuit in a low-voltage CMOS semiconductor process on a single die, with a relatively small number of interconnects (compared with prior art techniques) required to connect the die to components off-die (potentially such as inductors and capacitors), and requiring devices and capacitors having relatively small voltage ratings and passive components such as inductors and capacitors having relatively small sizes and values (compared with prior art techniques) required to support the intermediate voltage levels. In one embodiment, the output switching stage for switching among the different levels is implemented with CMOS devices in a manner that enables high switching speed at high efficiency, without the need for "floating" or "flying" switch drivers.

BRIEF DESCRIPTION OF THE DRAWINGS

The foregoing and other objects, features and advantages of the concepts, systems and techniques described herein will be apparent from the following description of particular embodiments, as illustrated in the accompanying drawings in which like reference characters refer to the same elements throughout the different views. The drawings are not necessarily to scale, emphasis instead being placed upon illustrating the principles of the concepts, systems, circuits and techniques for which protection is sought.

DETAILED DESCRIPTION

Figure 1:
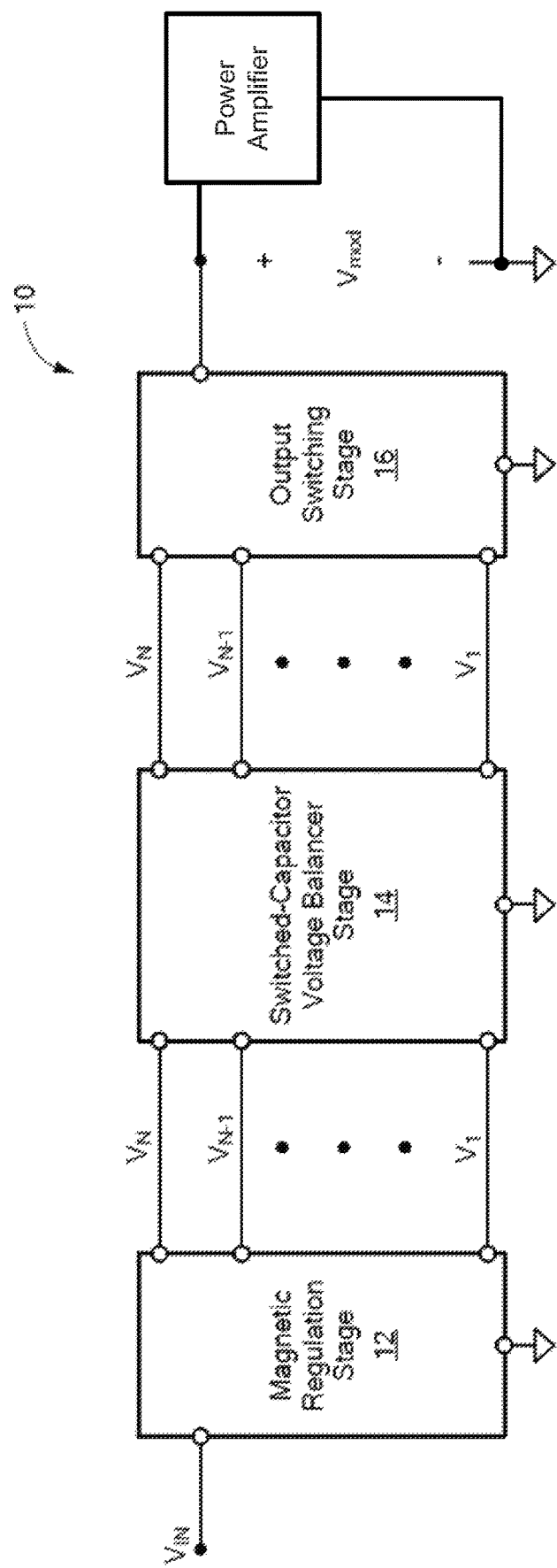
FIG. 1 is block diagram of an integrated power supply and modulator system.

Referring now to FIG. 1, an integrated power supply and modulator system 10 includes three subsystems: (1) a switched-capacitor (SC) voltage balancer stage 14; (2) a magnetic regulation stage 12; and (3) at least one output switching stage 16. It should be appreciated that aspects of the structure and function of these subsystems can be merged. However, the three subsystems are separately described hereinbelow to promote clarity in the written description of the drawing figures as well as clarity in the description of the broad concepts sought to be protected herein. As described, the magnetic stage 12 regulates the voltage while the SC voltage balancer stage maintains desired voltage ratios. As noted above, however, the three systems may also be thought of as being partially or even fully merged and thus an integrated power supply and modulation system provided in accordance with the concepts, systems, circuits and techniques described herein may be considered as being provided from a single subsystem, two subsystems or more than three subsystems.

The SC voltage balancer stage 14 regulates relative voltages on a set of capacitors, such that the voltages across the set of capacitors maintain a desired ratiometric relationship and/or that capacitor terminal voltages with respect to a common potential maintain a desired ratiometric relationship. These capacitor terminal voltages represent, for example, a set of discrete supply voltages utilized for supply switching. The SC voltage balancer may maintain ratiometric voltages (including identical voltages) across the set of capacitors. The SC voltage balancer may alternatively or in addition act as a multi-output switched capacitor converter, maintaining a ratiometric set of voltages between individual capacitor terminals and a reference potential. Energy is provided into SC voltage balancer Stage 14 via the magnetic regulation stage and is delivered to a power amplifier (not shown in FIG. 1) via the output switching stage 16. The magnetic regulation stage may provide energy and charge into one, two, or more than two ports of the SC voltage balancer stage.

Exemplary magnetic regulation stages, SC voltage balancer stages and output switching stages are described herein below. Those of ordinary skill in the art will appreciate, of course, that the exemplary magnetic regulation stages, SC voltage balancer stages and output switching stages may be implemented using any one of a large variety of different specific circuit implementations and techniques. Thus, the descriptions of such stages provided hereinbelow is not intended to be and should not be construed as limiting.

Figure 2B:
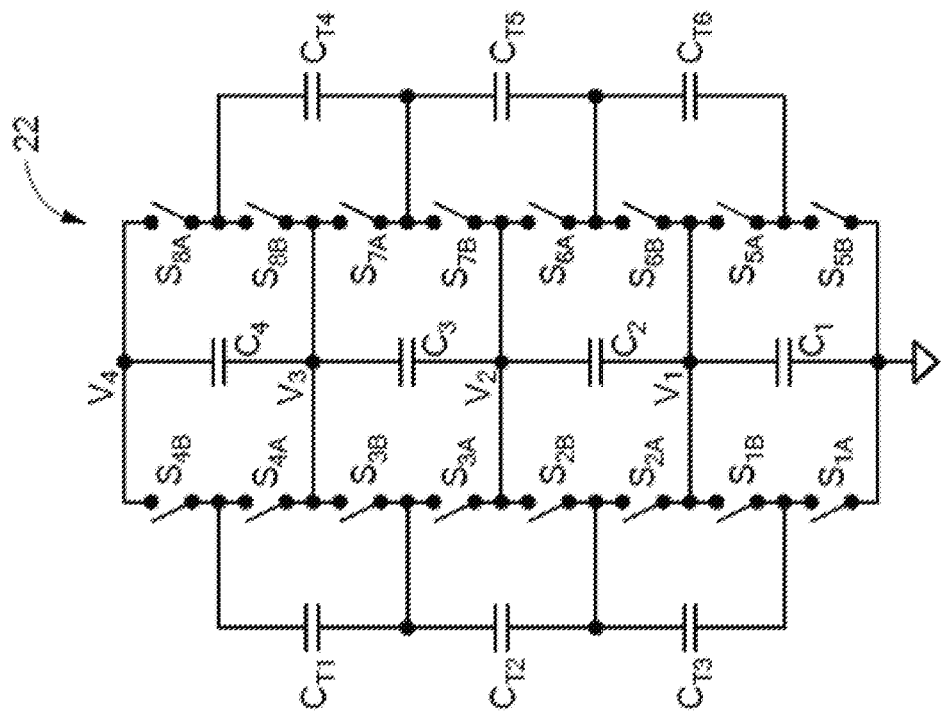
FIG. 2B is a schematic diagram illustrating a circuit topology for an alternate embodiment of an SC voltage balancer circuit.
Figure 2A:
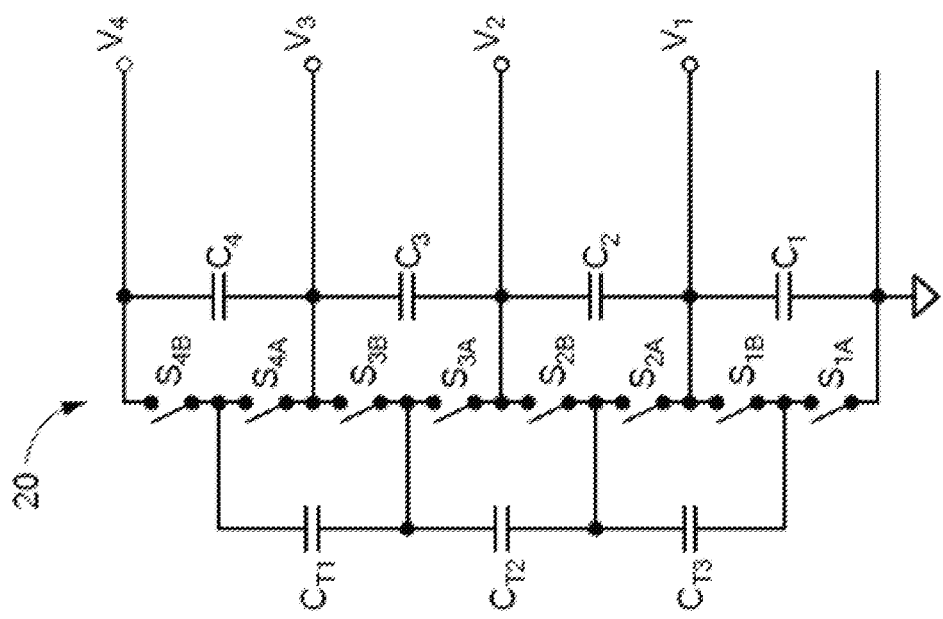
FIG. 2A is a schematic diagram illustrating a circuit topology for a switched-capacitor (SC) voltage balancer circuit.

Referring now to FIG. 2A, an exemplary SC voltage balancer stage 20 of a type which may be suitable for use in the integrated power supply and modulator system 10 of FIG. 1, includes an SC ladder circuit. The exemplary SC voltage balancer stage of FIG. 2A illustrates one possible implementation of an SC voltage balancer stage for a case with 4 voltage levels. It should, of course, be appreciated that any number of voltage levels may be used. The circuit is based upon an SC ladder circuit which may be similar to the type described in M. Seeman and S. Sanders, "Analysis and Optimization of Switched-Capacitor DC-DC Converters", *IEEE Transactions on Power Electronics*, March 2008 vol. 23, no. 2. However, unlike the aforementioned example, in the present system, energy and charge are input into the stage at multiple terminals and drawn from the stage at multiple terminals. The circuit maintains approximately equal voltages across capacitors $C_1$, $C_2$, $C_3$ and $C_4$, and maintains an approximate ratiometric relationships among voltages $V_1$, $V_2$, $V_3$, $V_4$ (with respect to common) of $V_1:V_2:V_3:V_4$ of 1:2:3:4, with charge introduced to and/or drawn from the voltage balancer at nodes labeled $V_1$, $V_2$, $V_3$, $V_4$.

Voltages $V_1$, $V_2$, $V_3$, $V_4$ correspond to discrete supply voltage levels provided by an SC voltage balancer stage (e.g. SC voltage balancer stage 14 in FIG. 1) to an output switching stage (e.g. output switching stage 16 in FIG. 1), with charge introduced to the voltage balancer by a magnetic regulation stage (e.g. magnetic regulation stage 12 in FIG. 1) via at least one of the terminals associated with $V_1$, $V_2$, $V_3$, $V_4$, and preferentially at two or more of these terminals, as described hereinbelow. Switches $S_{1A}$, $S_{2A}$, $S_{3A}$, $S_{4A}$ switch on and off together in a complementary fashion with switches $S_{1B}$, $S_{2B}$, $S_{3B}$, $S_{4B}$. The transfer capacitors $C_{T1}$, $C_{T2}$ and $C_{T3}$ transfer charge among capacitors $C_1$, $C_2$, $C_3$ and $C_4$ such that the voltage ratios $V_1:V_2:V_3:V_4$ are maintained approximately as 1:2:3:4. It will be appreciated that this SC balancer stage topology could be employed to provide a subset of these voltages, and other SC balancer topologies or multi-output switched-capacitor converter topologies could be employed providing different ratiometric relations. For example, a balancer providing 8:4:2:1 could be realized with appropriate circuit structures. The exemplary SC voltage balancer stage circuit topology of FIG. 2A is of particular advantage for CMOS implementation for a number of different reasons including, but not limited to: (1) the individual (switch) device and capacitor voltages are individually maintained as small voltages (i.e., of scale $V_1$ as compared to the larger maximum synthesized voltage $V_4$), enabling high switching speed, small die size, and high energy density; (2) control and level-shifting circuitry required in this exemplary implementation are simpler, require lower complexity and die area and are more easily implemented than in other circuits and can be easily implemented on the same CMOS die. The circuit is designed/constructed in such way that no flying drivers are required for the switches. And all the control and level-shifting circuitries are referenced to fixed potentials. All those advantages make the control and level-shifting circuitry simpler and (3), the implementation requires a number of off-die connections which is relatively small compared with the number of off-die connections required in prior art approaches, principally at nodes connecting to $C_1$-$C_4$ and $C_{T1}$-$C_{T3}$.

It will, of course, be appreciated that there are other variants with similar advantages. For example, as illustrated in FIG. 2B, by adding an additional set of transfer capacitors $C_{T4}$-$C_{T6}$ and switches $S_{5A}$-$S_{8A}$ (operated in-phase with switches $S_{1A}$-$S_{4A}$ and out-of-phase with switches $S_{1B}$-$S_{4B}$) and switches $S_{5B}$-$S_{8B}$ (operated in-phase with switches $S_{1B}$-$S_{4B}$ and out-of-phase with switches $S_{1A}$-$S_{4A}$), the two sets of transfer capacitors ($C_{T1}$-$C_{T3}$ and $C_{T4}$-$C_{T6}$) operate with their respective sets of connections to the capacitor stack of $C_1$-$C_4$ made in a complementary fashion. In this manner, one can implement an interleaved switched capacitor voltage balancer stage 22. Such an implementation includes a greater number of components and die interconnects than the embodiment of FIG. 2A. On the other hand, the interleaved switched capacitor voltage balancer stage approach reduces the required capacitor volume, along with reducing switching ripple and loss. The interleaved switched capacitor voltage balancer stage approach could also enable partial or complete "soft charging" of some or all of the capacitors in the switched-capacitor voltage balancer stage by the output switching stage and load, thereby improving the tradeoff between switching frequency and loss characteristics.

Likewise, the implementations of FIGS. 2A and 2B could utilize resonant switched-capacitor operation with the addition of properly sized inductors in series with the energy transfer capacitors. It will be appreciated that while the topologies of FIGS. 2A and 2B provide at least the above-noted particular advantages, other switched-capacitor topologies could also be employed.

The output switching stage 16 (FIG. 1) dynamically selects from among one or more of the capacitor voltages (e.g., $V_1$-$V_4$ in FIG. 2A). The switching network for doing so can be implemented in a number of ways.

Figure 3B:
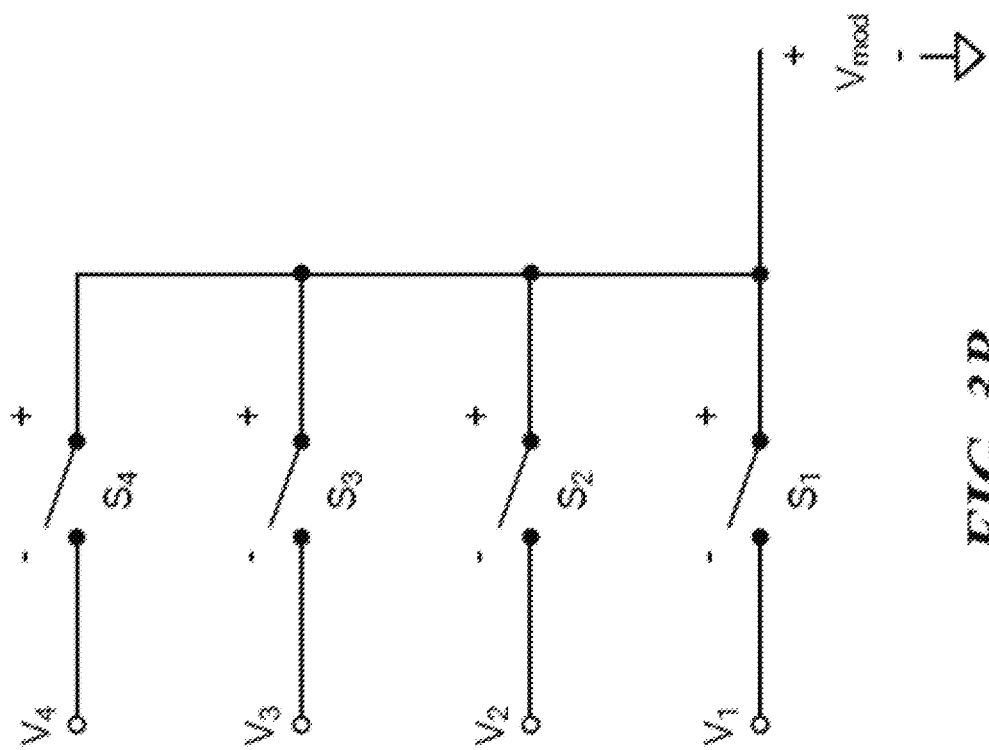
FIG. 3B is a schematic diagram of an alternate embodiment of an exemplary switching network of an output switching stage.
Figure 3A:
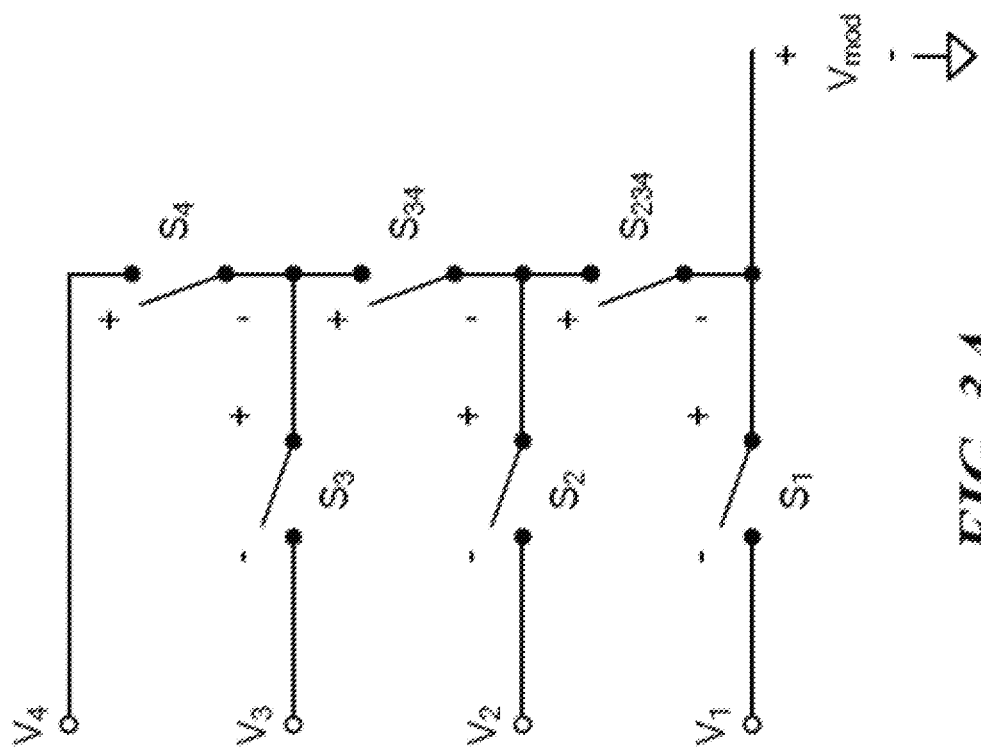
FIG. 3A is a schematic diagram of an exemplary embodiment of a switching network for an output switching stage.

FIGS. 3A and 3B, for example, illustrate a basic structure of two exemplary switching networks that can be applied for this function; versions of each of these two approaches are described in J. L. Dawson, D. J. Perreault, E. W. Huang, S. Chung, and P. A. Godoy, "Asymmetric Multilevel Outphasing Architecture for RF Amplifiers," U.S. Pat. No. 8,026,763 B2, Sep. 27, 2011. It should be appreciated that while the basic structures as shown in FIGS. 3A, 3B are similar to those previously known, the particular implementations and driving methods as described herein (e.g. in conjunction with FIGS. 4A, 4B, 5, 12A and 12B) are distinguished over what has been previously shown in terms of how the switch networks are implemented and how they are driven.

Considering a base voltage $V_1$ as being 1 per unit (p.u.), with higher voltages $V_2$-$V_4$ related ratiometrically as described previously, one can identify switch voltage blocking requirements as follows: In FIG. 3A, $S_4$, $S_{34}$, $S_{234}$, and $S_3$ each must block +1 p.u. voltage, while $S_2$ blocks +2 p.u. voltage and $S_1$ blocks +3 p.u. voltage. In FIG. 3B, switch $S_1$ must block +3 p.u., $S_2$ must block both +2 p.u. and -1 p.u. voltage, $S_3$ must block +1 and -2 p.u. voltage and $S_4$ must block -3 p.u. voltage.

Factors for achieving improvements in the switching stage as compared to direct implementations of FIGS. 3A and 3B include, but are not limited to: 1. realizing the level shifting and drive functions in manners that avoid the need for "flying" switch drivers or level shifters and avoid the need for external gate drive "bootstrap" capacitors; and/or 2. realizing the switch functions (or switches) in a manner that enables fast, efficient switching, and especially in a manner that can be directly realized in low-voltage integrated processes.

Figure 4A:
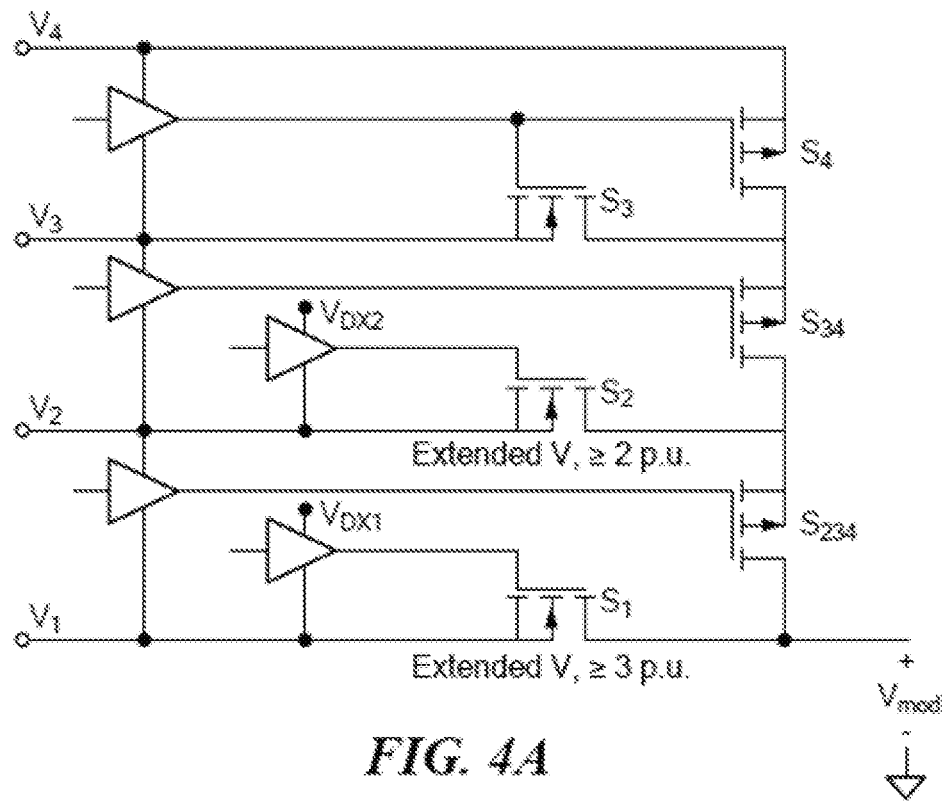
FIG. 4A is a schematic diagram of an alternate exemplary embodiment of an output switching stage which includes extended voltage devices.
Figure 4B:
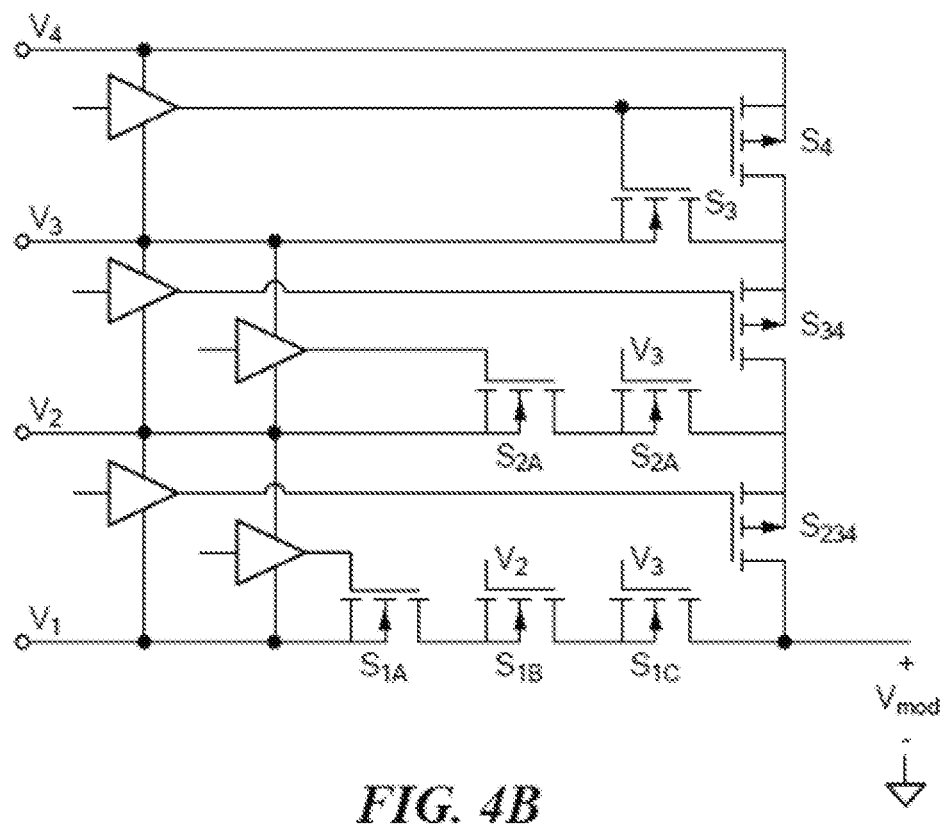
FIG. 4B is a schematic diagram of an alternate exemplary embodiment of an output switching stage which does not include extended voltage devices.

Referring now to FIG. 4A, one implementation of a circuit to implement the function described above in conjunction with FIG. 3A in a manner that requires no flying drivers or external "bootstrap" capacitors includes a plurality of driver circuits (or more simply "drivers") at least some of which are coupled to extended voltage devices. This improves switching frequency capability, reduces the need for off-die interconnections (e.g., to bootstrap capacitors) and simplifies signal level-shifting circuits for control. Some of the switches are implemented using low-voltage "core" CMOS devices (NMOS or PMOS), enabling particularly low-loss switching, while others are "extended voltage" devices (e.g., requiring greater than 1 p.u. voltage rating).

Switch types are indicated in FIG. 4A, and switches so labeled are indicated to have extended voltage ratings as compared to other switches rated for a base value of at least 1 p.u. The drivers for these extended voltage devices are not "flying"; the drive voltage required (e.g., as illustrated for the drivers) will depend on the particular semiconductor process)—$V_{DX2}$ may be tied to $V_3$ or $V_4$, for example, and $V_{DX1}$ may be tied to $V_2$, $V_3$, or $V_4$ depending upon process requirements. For example, depending upon the particular process, the gate voltage may need to be switched to a different voltage potential to have large enough gate-source voltages to obtain sufficiently low on-resistance. It will likewise be appreciated that the exact voltage levels used for various drivers may be adjusted depending upon process requirements; what is key is that flying drivers and bootstrap capacitors are not required.

In some applications, it may be desired to realize the output switching stage without needing extended voltage devices. This can be accomplished, for example, by using cascode switch structures in place of one or more of the extended-voltage switches. Such an exemplary embodiment illustrated in FIG. 4B. Implementing such a structure requires careful attention to the device sizes/capacitances of the cascoded device sets (e.g., $S_{2A}$/$S_{2B}$ and $S_{1A}$/$S_{1B}$/$S_{1C}$); the devices sizes and capacitances can be selected to provide voltage sharing among the devices in the off state. It will be further appreciated that the use of cascode switches and extended voltage switches can be combined (e.g., resulting in hybrids of the circuits of FIGS. 4A and 4B.)

Figure 5:
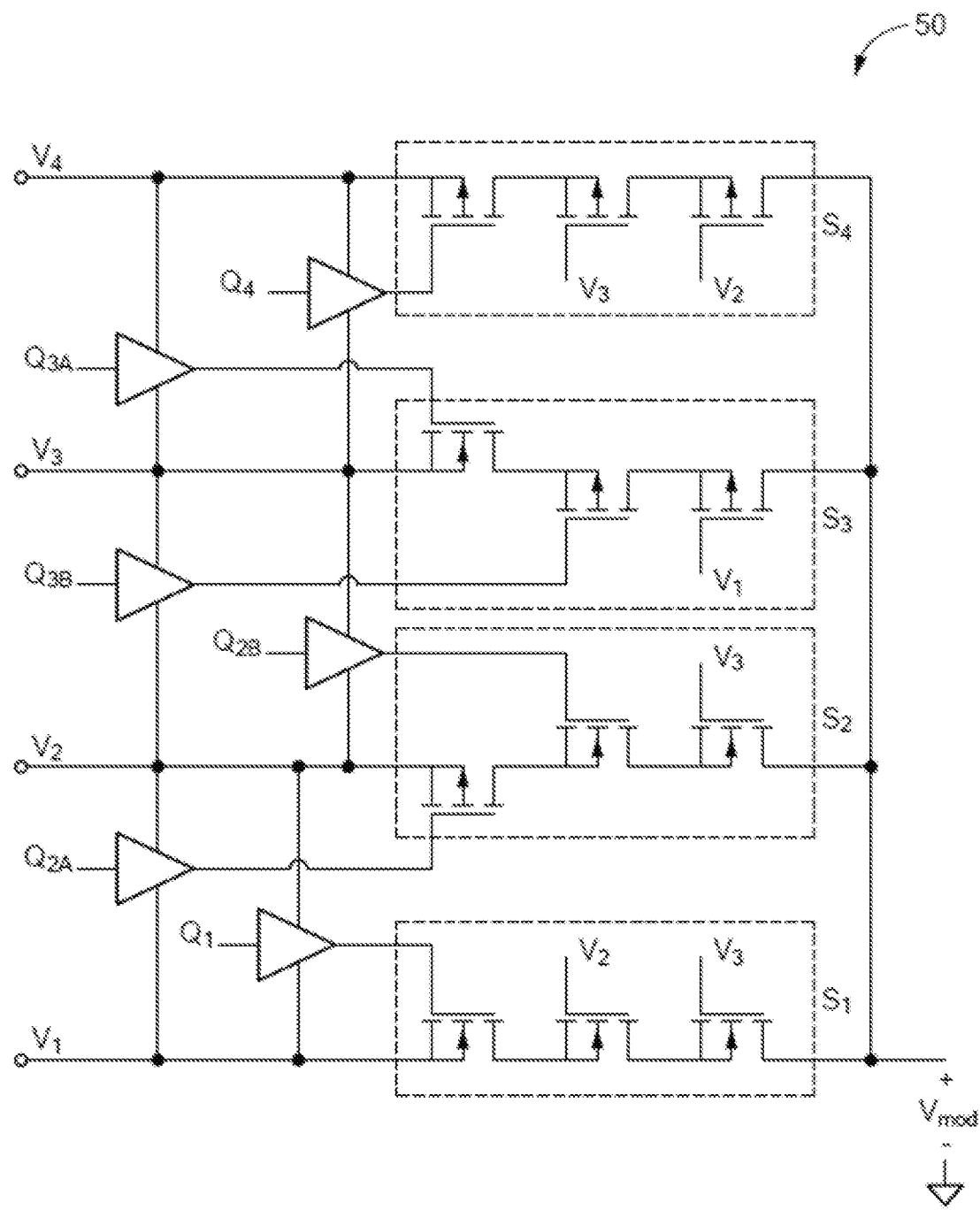
FIG. 5 is a schematic diagram of an exemplary embodiment of an output switching stage implemented using low-voltage complementary metal oxide semiconductor (CMOS) devices.

Referring now to FIG. 5, a circuit 50 includes a plurality of drivers $Q_1$-$Q_4$ coupled to switches $S_1$-$S_4$ (with switches indicated by the dashed boxes). Each of switches $S_1$-$S_4$ include a plurality of switching devices FET1-FET3 with at least one of devices FET1-FET3 in each switch being coupled to an output of a driver. Circuit 50 illustrates how the switch architecture of FIG. 3B can be realized using only low-voltage CMOS devices (through cascoded structures) and without requiring flying drivers or off-chip connections for bootstrap capacitors. Given devices each of 1 p.u.

voltage rating, the combined elements provide switching with voltage blocking as follows: switch $S_1$ blocks +3 p.u., $S_2$ blocks both +2 p.u./−1 p.u. voltage, $S_3$ block +1 p.u./−2 p.u. voltage and $S_4$ blocks −3 p.u. voltage. As each of the individual devices forming the switching elements only need to have drain-source ratings of 1 p.u., in many CMOS processes they could be implemented with fast core devices. As described above, the individual devices in a cascode stack may be sized (or provided with additional capacitance) to yield acceptable voltage sharing in the off state. It will also be appreciated that some or all of the cascode stacks could be replaced with higher voltage devices (having ratings of more than 1 p.u. as needed). Table 1 shows the driver switching used to generate the desired output switching (i.e. Table 1 shows driver output states needed to achieve different modulator output voltages).

It should be appreciated that other implementations of the output switch stage network consistent with the concepts, systems, circuits and techniques described herein may be similarly realized.

Figure 6:
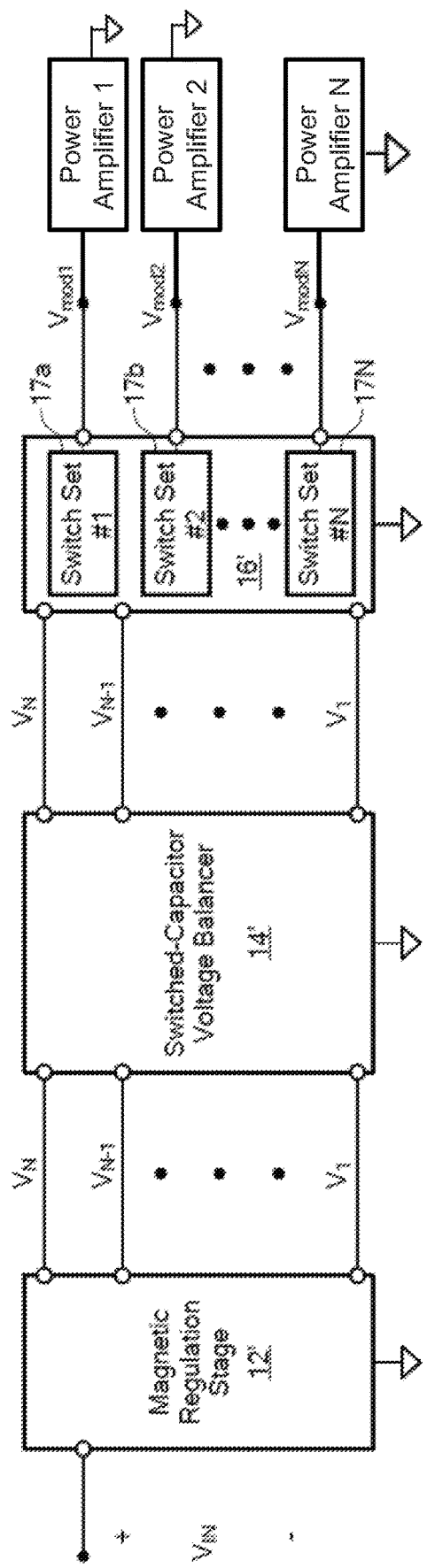
FIG. 6 is a block diagram of an integrated power supply and modulator system which includes an output switching stage which includes a plurality of switching stages (or a switching stage with a plurality of switch sets) to supply different amplifiers and/or modulate voltage of different amplifier stages in a multi-stage amplifier.

For example, referring now to FIG. 6, an integrated power supply and modulator system 10' which may be similar to the integrated power supply and modulator system 10 described in conjunction with FIG. 1, includes three subsystems: (1) a switched-capacitor (SC) voltage balancer stage 14'; (2) a magnetic regulation stage 12'; and (3) at least one output switching stage 16' which includes a plurality of switch sets 17a-17N. Thus, integrated power supply and modulator system 10' is capable of supplying different amplifiers and/or modulate the voltage of different amplifier stages in a multi-stage amplifier.

An integrated power supply and modulator system such as integrated power supply and modulator system 10' finds application in systems having a plurality of power amplifiers. That is, in systems having a plurality of power amplifiers, an integrated power supply and modulator system may include a plurality of output switching stages or a single output switching stage having a plurality of switch sets (or a combination of the two configurations) to supply different amplifiers and/or modulate the voltage of different amplifier stages in a multi-stage amplifier.

Such a system may find use, for example, when addressing power amplifier systems supporting LTE-Advanced Carrier Aggregation and transmit diversity (either on the base station or user equipment side) where multiple PA's are transmitting at the same time, such simultaneous operation of multiple output switching stages for these different transmitting PA's and stages would be enabled. When modulating smaller size PA driver stages the output switching stages can be differently sized and optimized taking into account lower transmitted power requirements by the driver stages.

TABLE 1

| $V_{mod}$ | $Q_1$ | $Q_{2A}$ | $Q_{2B}$ | $Q_{3A}$ | $Q_{3B}$ | $Q_4$ |
|---|---|---|---|---|---|---|
| $V_1$ | H | H | X | X | H | H |
| $V_2$ | L | L | H | X | H | H |
| $V_3$ | L | X | L | H | L | H |
| $V_4$ | L | X | L | L | X | L |

In some applications, the output switching state voltage $V_{mod}$ may be applied directly to a power amplifier. However, in some applications, further processing of this voltage may be desired. This may include, for example, additional linear regulation and/or amplification to provide continuous output voltage control or to control the transitions between levels. Linear regulation or amplification circuitry (e.g., a pass transistor and controls) may optionally be placed on the same die with the rest of the power supply and modulator system.

Figure 7:
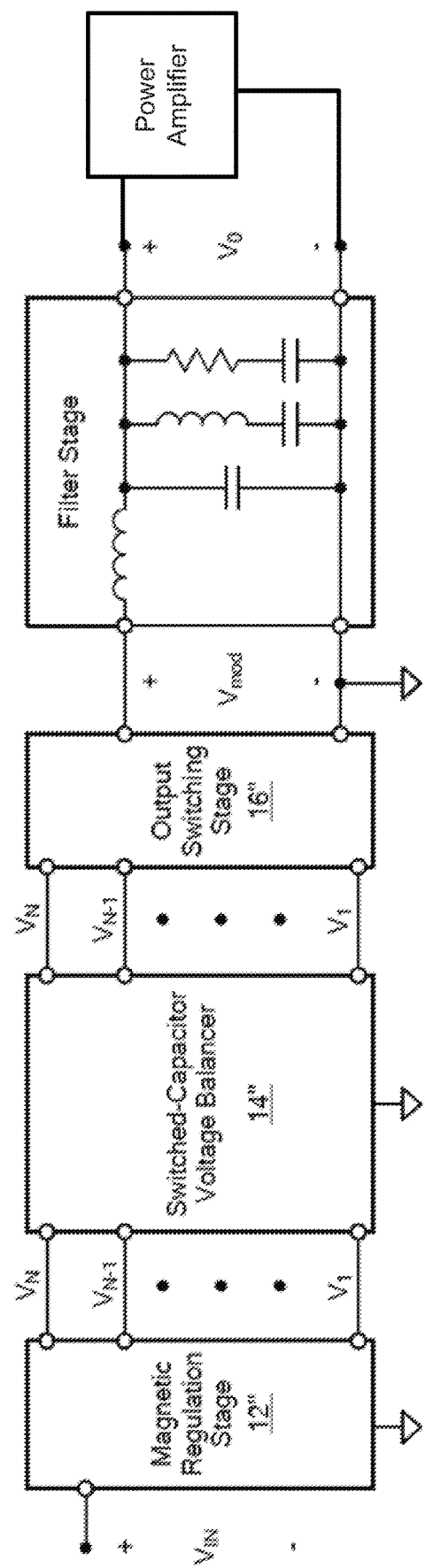
FIG. 7 is a bock diagram of an integrated power supply and modulator system having an output filter stage.

Referring now to FIG. 7, instead or in addition to additional linear regulation and/or amplification, one may provide additional filtering of the voltage $V_{mod}$ through an added filtering stage, as illustrated in FIG. 7. It will be appreciated that a wide variety of filter types might be employed, including to meet the needs of output waveform frequency content, receive-band noise suppression, etc. To achieve continuous output voltage control (e.g., for envelope tracking) one can modulate among levels at a fast rate, and using the filter stage to filter this waveform to provide the desired average voltage. Alternatively, an added filtering stage can be used to shape transitions among switching levels such that the output voltage has only desired frequency content.

The magnetic regulation 12 stage regulates the switched-capacitor voltage balancer outputs while the distribution of the conversion ratios are maintained by the balancer. With this feature, the output power of a PA can be scaled down continuously while maintaining high efficiency (e.g. to provide efficient backoff over a wide average power range). In addition, the output (or set of ratiometric outputs) can be held to a desired level as the input supply voltage varies (e.g., to reduce the effects of battery voltage variation/discharge on operating range of the PA).

One conventional approach would be to cascade a magnetic converter (providing regulation) with an SC stage (to generate multiple levels). For such a case with a boost-topology magnetic converter feeding the top voltage of the SC stage, and inductor current ripple $\Delta I$ in the boost inductor, the inductance needs to be $V_{IN}/\Delta I*((V_{OUT}-V_{IN})/V_{OUT})/f_{sw}$ with given switching frequency $f_{sw}$ and input and output voltages, $V_{IN}$ and $V_{OUT}$ (or $V_4$ in the 4-level SC voltage balancer). For slow switching frequencies and/or large difference between input and output voltages, the required inductor size could be large.

Figure 8:
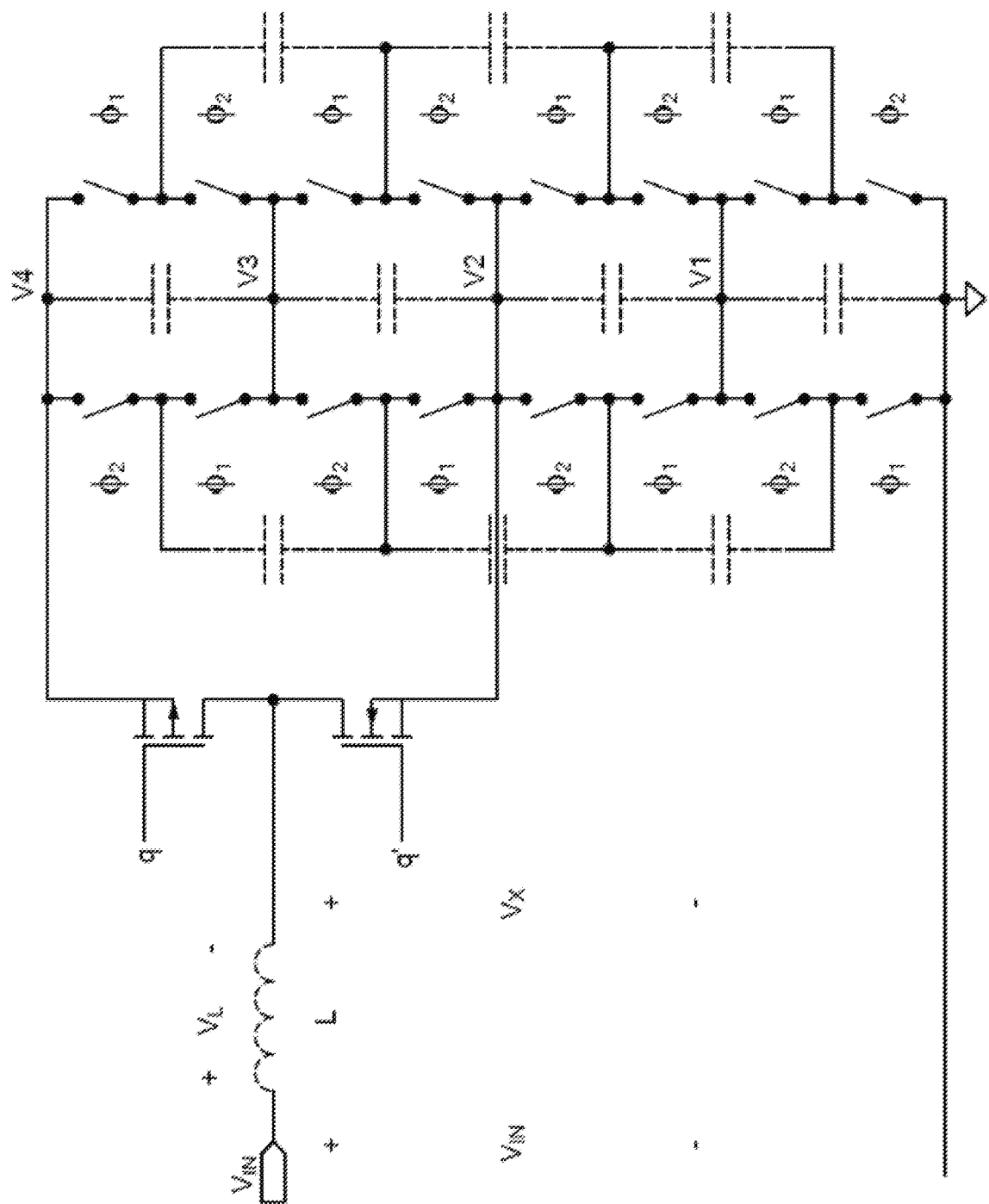
FIG. 8 is a schematic diagram of a magnetic regulation stage cascading into a four-level interleaved SC voltage balancer stage.

To overcome this drawback, an approach such as that described in FIG. 8 may be used, in which the magnetic regulation stage supplies charge to more than one of the SC stage nodes over a switching cycle.

Referring now to FIG. 8, shown is an exemplary magnetic regulation stage cascading into an N-level interleaved SC voltage balancer stage. To promote clarity in the description, the N-level interleaved SC voltage balancer stage is illustrated as a 4-level interleaved SC voltage balancer stage in FIG. 8. Instead of switching the boost inductor output terminal between the input of the SC voltage balancer and ground (as would be done with a boost converter), the boost inductor is switched between the intermediate voltage levels in the SC voltage balancer stage. In the exemplary embodiment of the circuit in FIG. 8, the inductor terminal is switched between $V_2$ and $V_4$ (or $V_{OUT}$) in the SC voltage balancer, but it can be connected among any levels in general. Operation in this manner is possible owing to the action of the SC voltage balancer to appropriately redistribute charge among the various levels, maintaining the desired voltage ratios.

Regulation of the SC voltage balancer voltages can be obtained by pulse width modulation (PWM) control of the regulation stage. With the configuration in FIG. 8, the output voltage V4 is $2V_{IN}/(1+D)$ in steady state (D is the duty ratio for q). So the steady state value of $V_4$ can be adjusted from $V_{IN}$ to $2V_{IN}$. With this configuration, for inductor current ripple $\Delta I$, the required inductance is $(V_{IN}-V_2)/\Delta I*((V_{OUT}-V_{IN})/(V_{OUT}-V_2))/f^w$. With $V_2=V_{OUT}/2$, the required inductance in the proposed configuration is only $(2V_{IN}-V_{OUT})/V_{IN}$ of the required inductance in the conventional design ($V_{OUT}>V_{IN}$). This advantage in inductor value and size can become greater for higher-level SC voltage balancers (e.g., more levels).

Moreover, the switches in the regulation stage are only required to block the difference in intermediate voltages levels used for switching. Thus, for example, the regulator switches in FIG. 8 must block 2 p.u. voltage (the difference between $V_4$ and $V_2$ in the SC voltage balancer) instead of the full output voltage of the SC stage (4 p.u., or the difference between V4 and ground) as would be needed in a boost converter. Switches with lower voltage ratings can be used to achieve faster switching speed and better performance.

To leverage the benefits of low voltage device in CMOS technology, cascoded devices can be implemented in the regulation stage.

Figure 9:
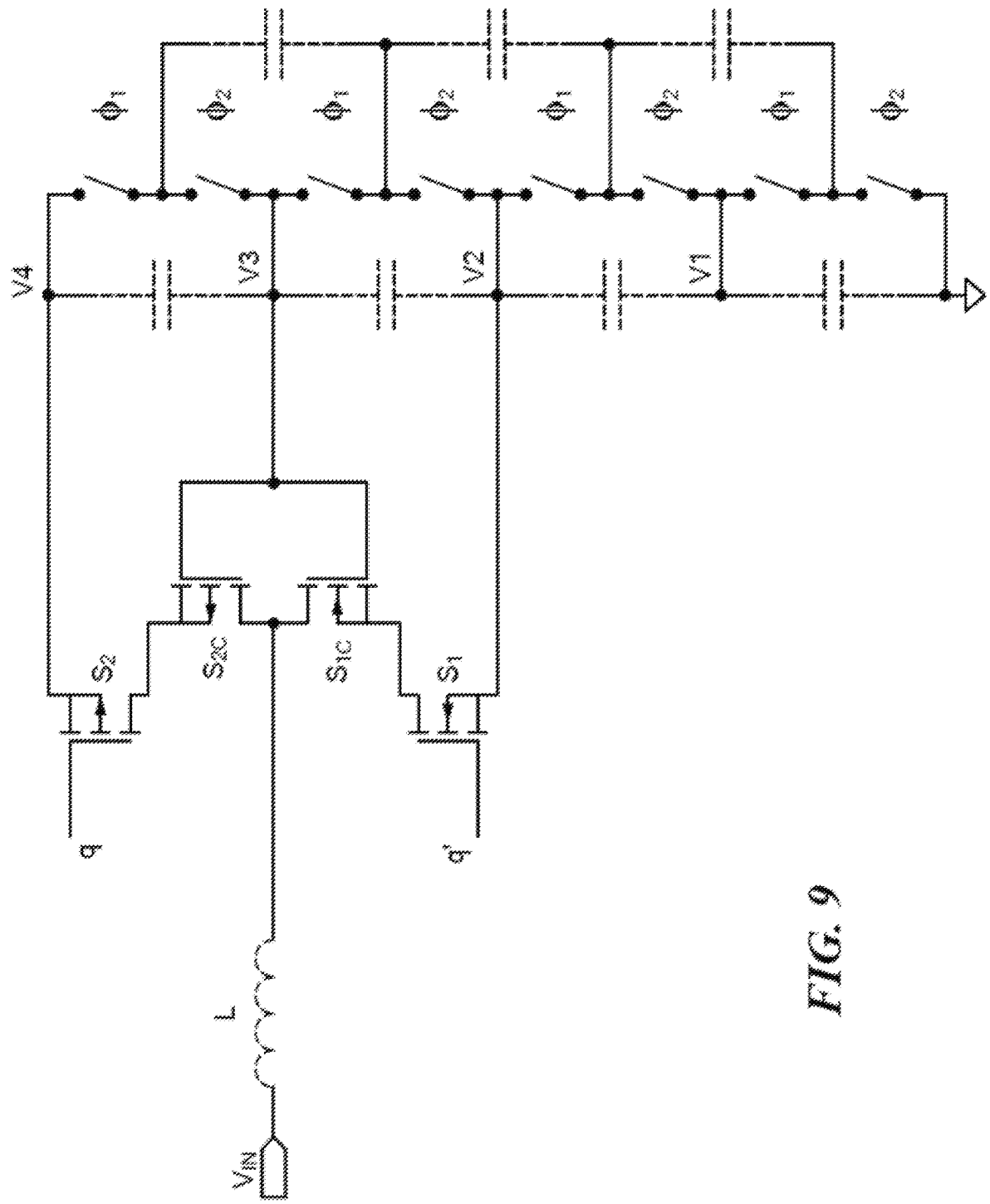
FIG. 9 is a schematic diagram of a magnetic regulation stage provided with a switching network having cascoded devices.

FIG. 9 illustrates a cascoded device configuration for realizing the switches in the regulation stage. The gates of the cascoded device $S_{1C}$ and $S_{2C}$ are connected to the dc level $V_3$ in the SC voltage balancer. When the switch $S_1$ is turned on, the drain of $S_1$ (or source of $S_{1C}$) discharges low enough until the gate source voltage of the cascoded device $S_{1C}$ is greater than the threshold voltage, $S_{1C}$ will be turned on. During the turn-off cycle, the drain of $S_1$ (or source of $S_{1C}$) charges until the gate source voltage of the cascoded device $S_{1C}$ is smaller than the threshold voltage, $S_{1C}$ will be turned off. The cascoded device $S_{2C}$ operates the same as device $S_{1C}$. In the cascoded device implementation, each device is only required to block half of the total blocking voltage, and hence devices with lower voltage ratings can be used. Moreover, it will be appreciated that with this implementation and the implementation of FIG. 8, flying drivers and bootstrap capacitors are not required for driving the switches.

In general, when the output of the regulation stage is connected between the $m_{th}$ level and the $n_{th}$ level of a k-level SC converter, the voltage of the top level ($k_{th}$ level) can be regulated as in equation (1):

$$V_k = \frac{V_{IN} \cdot k}{n + (m-n)D} \quad (1)$$

D is the duty of the switch q (top switch). It is noted that the switching frequency of the regulation stage can be different from that of the SC voltage balancer stage and each of these can be different from the switching frequency of the output switching stage.

Figure 10:
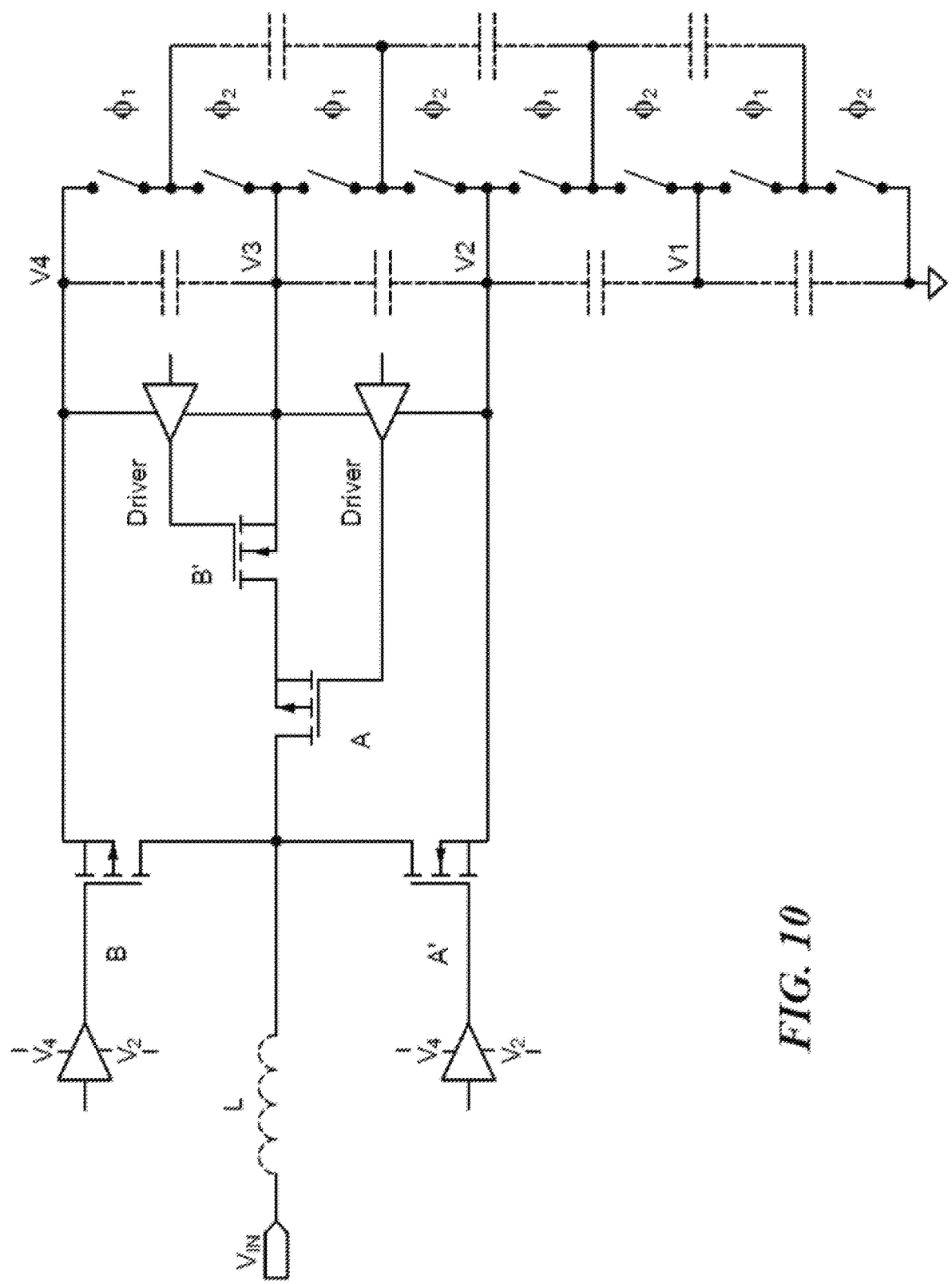
FIG. 10 is a schematic diagram of a multi-level magnetic regulation stage.

Referring now to FIG. 10, a multi-level regulation stage is coupled to an SC voltage balancer. In this configuration, the output of the regulation stage is connected among up to three intermediate levels of the SC voltage balancer. In this case, the voltage swing across inductor L is further reduced, consequently reducing the required inductance for a given current ripple ΔI. No flying driver is required in this design; all the drivers are referenced between dc levels $V_4$, $V_3$ and $V_2$. When B' is held on (high), A and A' can be modulated and the output terminal of the inductor switches between $V_3$ and $V_2$ (delivering charge to those nodes, and regulating the voltage according to (1). When A is held on (low), B and B' can be modulated and the output terminal of the inductor switches between $V_4$ and $V_3$ (again regulating the voltage according to (1)).

It will be appreciated that in general—with appropriate switch implementations—the output terminal of the inductor can be switched among any of the SC voltage levels that are desired (as well as ground, if desired). Generally, increasing the numbers of levels that can be switched among increases the achievable regulation range, and helps improve inductor size and ripple that is required. Such operation is possible because the SC stage redistributes charge among the levels to maintain the ratiometric relation between capacitor voltages.

It will also be appreciated that continuous switching need not always be used: one can hold the output terminal of the inductor at a specific level. This will not provide continuous regulation, but will enable the highest efficiency of energy transfer owing to the elimination of switching and gating loss in the regulation stage. It will be further appreciated that additional control means can be used for regulation, including burst-mode or on/off control, current-mode control, hysteresis control, pulse-skipping control, single or multi-level sigma-delta control, etc.

Figure 11:
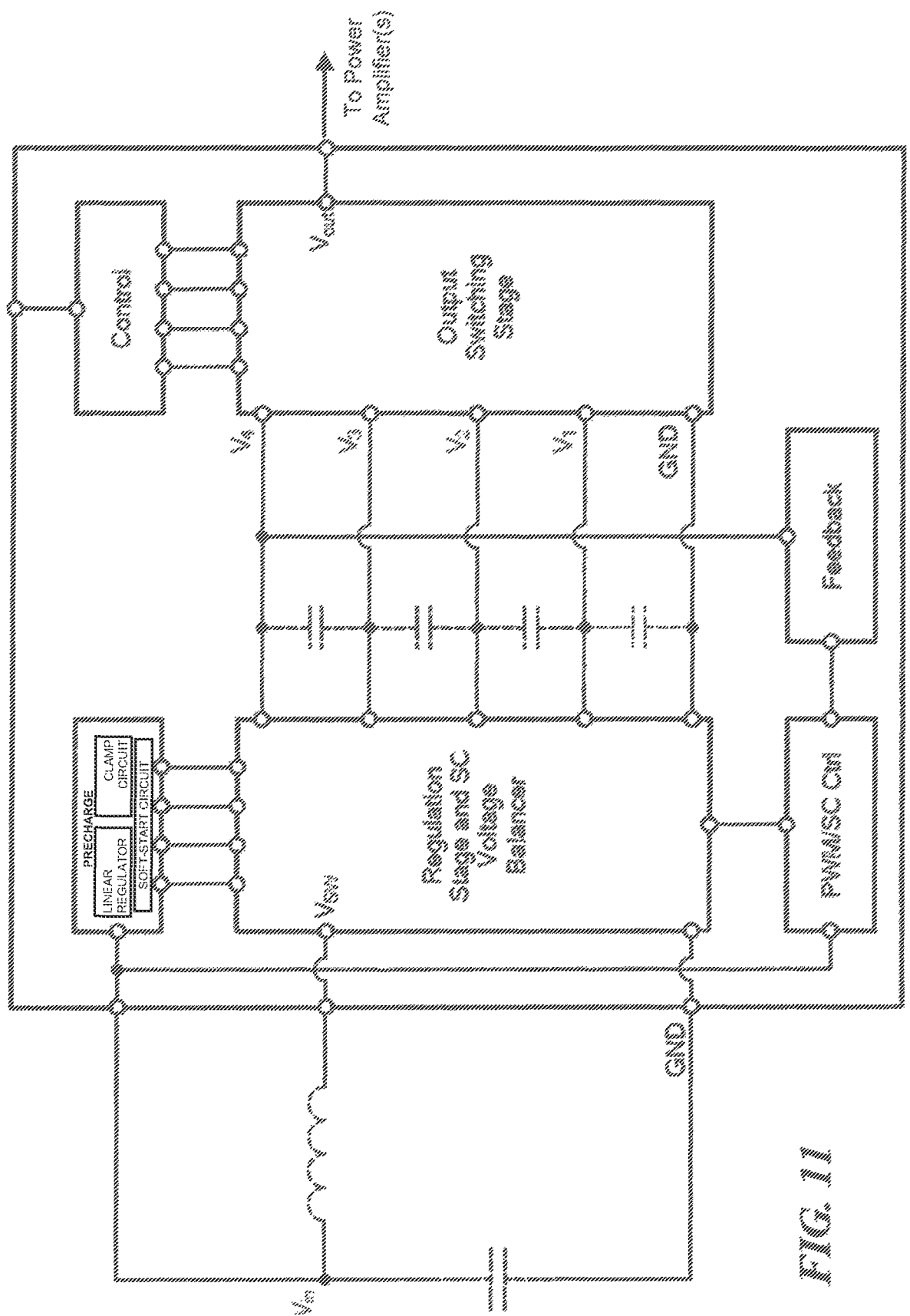
FIG. 11 is a block diagram of an integrated power supply and modulator system including startup circuitry, feedback/feedforward circuitry and control circuitry.

Referring now to FIG. 11, an integrated power supply and modulator system includes a switched-capacitor voltage balancer stage coupled between a magnetic regulation stage and at least one output switching stage. The system further includes startup circuitry, a control system and a feedback system. Thus, FIG. 11 illustrates an overall system. In addition to the blocks previously described, several additional elements may be present in the whole system. The startup circuitry may include, for example, a "precharge" system. The precharge system may include a circuit to precharge the capacitors in each level to the desired voltages and prevent the devices from exceeding their rated breakdown voltages during start-up or transients. For example, linear regulator, clamping or other circuitry may be used to bring the individual capacitor voltages uniformly into an allowable range, and the system may further include one or more blocking switches to protect the system from out-of-range input voltages. The precharge system may also include "soft-start" for the magnetic regulation function of the system, under-voltage lockout for various system functions, etc.

Figure 12A:
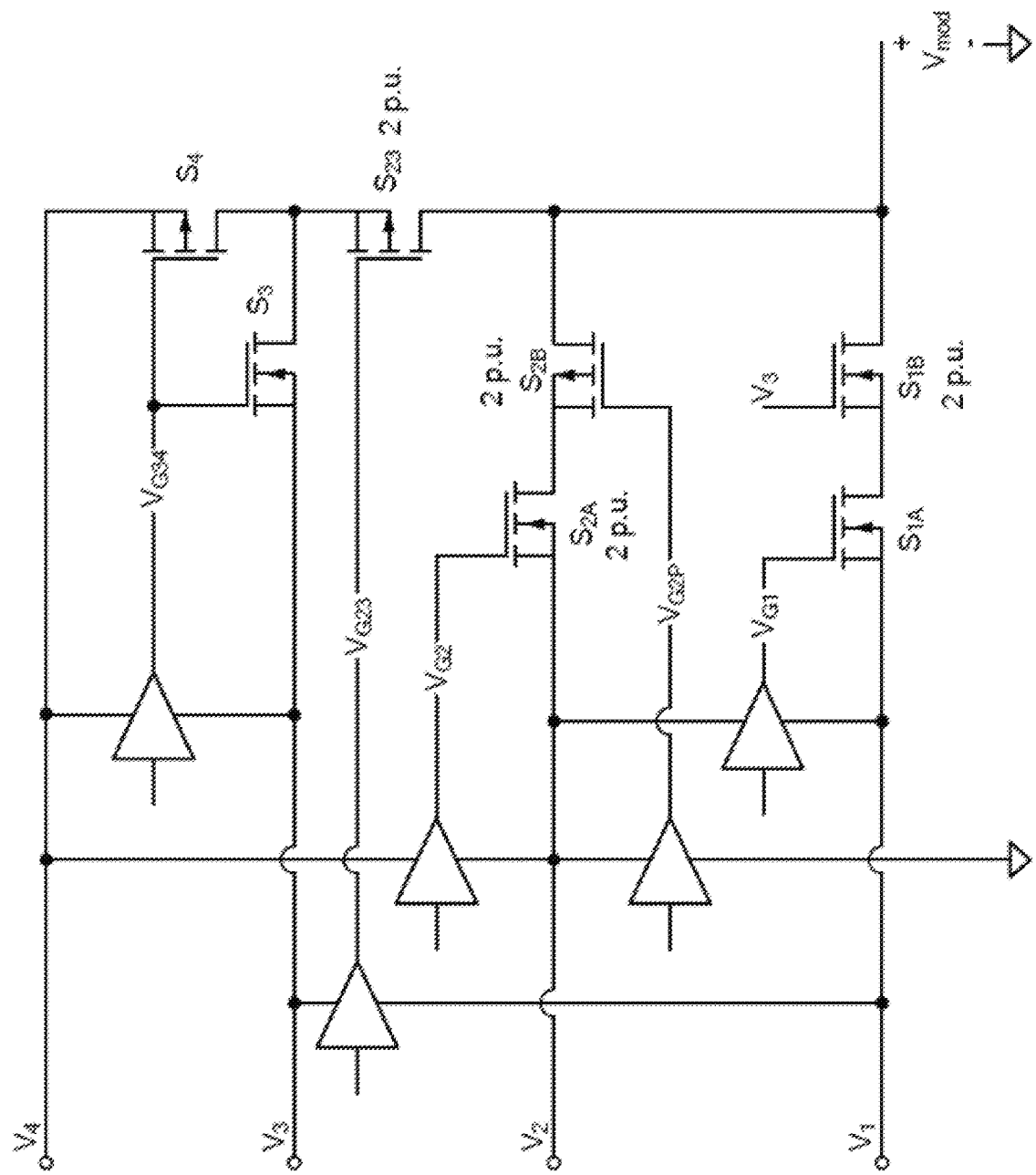
FIG. 12A is a schematic diagram of an implementation of a modulator stage, including gate drivers.

Referring now to FIG. 12A an implementation of a modulator stage, including gate drivers is shown. This implementation takes advantage of the set of ratiometric voltages available to avoid the need for "flying" gate drivers and bootstrap capacitors, takes advantage of the power stage capacitors for the drivers, and enables simple level-shifting for inputs to the drivers.

It is assumed in this design example that $V_1$=1.2 V, $V_2$=2.4 V, $V_3$=3.6 V, and $V_4$=4.8 V. "Base" switches for implementing the circuit of FIG. 12A may be rated, for example, at 1.8 V drain-source voltage, and switches labeled "2 p.u." (e.g. switches $S_{1B}$, $S_{2A}$, $S_{2B}$ and $S_{23}$) may be rated at 3.3 V drain-source voltage for implementation in a typical 180 nm node semiconductor process.

In the driver scheme, every gate driver is referenced to a fixed potential. 1.2 V gate-source voltage is provided to drive the 1.8 V devices and 2.4 V-3.6 V gate-source voltage is provided to drive the 3.3 V devices. The switch states implemented by the gate drivers are shown in Table 1 below.

TABLE 1

|  | $S_{1A}$ | $S_{1B}$ | $S_{2A}$ | $S_{2B}$ | $S_{23}$ | $S_3$ | $S_4$ |
|---|---|---|---|---|---|---|---|
| $V_1$ | 1 | 1 | 1 | 0 | 0 | 1 | 0 |
| $V_2$ | 0 | 0 | 1 | 1 | 0 | 1 | 0 |
| $V_3$ | 0 | 0 | 0 | 1 | 1 | 1 | 0 |
| $V_4$ | 0 | 0 | 0 | 1* | 1 | 0 | 1 |

Table 1 shows the switch states required to achieve desired output voltages for the circuit in FIG. 12A The asterisk * in Table 1 indicates that the switch $S_{2B}$ has its gate voltage switched from ground to $V_2$ in this state to prevent the device from damaging the gate.

Figure 12B:
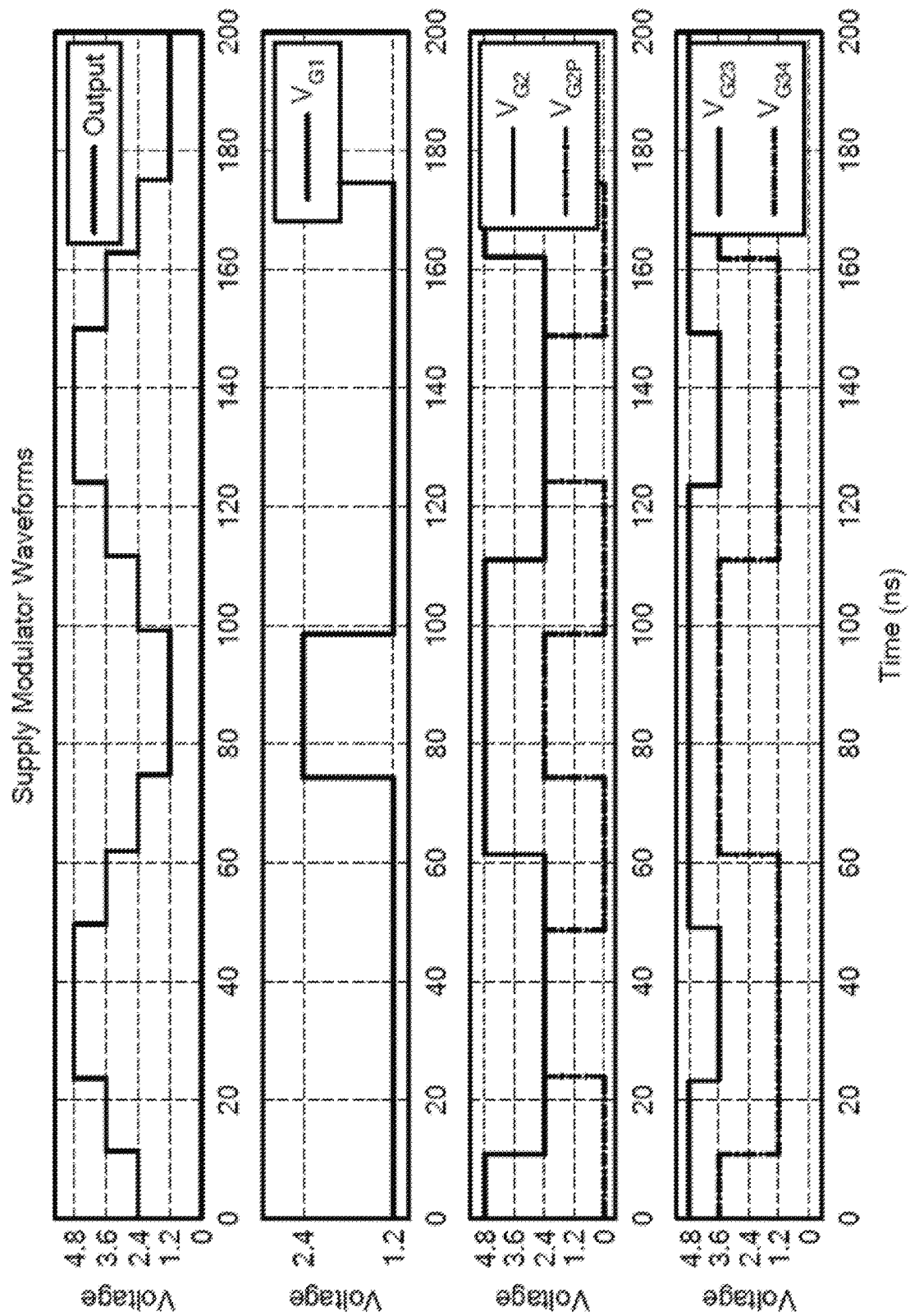
FIG. 12B is a plot of operating waveforms for the circuit of FIG. 12A.

FIG. 12B shows the voltages associated with selecting various output levels. In the staircase voltage pattern demonstrated in this example, every device has the same switching frequency as the staircase (once on/off cycle per staircase period) except $S_{2B}$, which switches at twice this frequency. The reason this switch is modulated more often is to provide sufficient gate drive for the 3.3 V devices and also limit the gate-source voltage of the device within the safe operation range (e.g., to limit the gate-source voltage to maximum of 3.6 V for a typical 180 nm node semiconductor process).

While particular embodiments of concepts, systems, circuits and techniques have been shown and described, it will be apparent to those of ordinary skill in the art that various changes and modifications in form and details may be made therein without departing from the spirit and scope of the concepts, systems and techniques described herein. For example, the presented implementation examples show a system with a boost-type (or boost-derived) magnetic regulation stage. It will be appreciated that by adding appropriate switches and connections, other magnetic regulation stage topologies could likewise be used, including buck-boost derived topologies. Similarly, alternative switched-capacitor conversion structures could be employed, and other output switching network topologies or switch implementations could be employed. Other combination or modifications are also possible al of which will be readily apparent to one of ordinary skill in the art after reading the disclosure provided herein.

It is felt, therefore that the concepts, systems, circuits and techniques described herein should not be limited by the above description, but only as defined by the spirit and scope of the following claims which encompass, within their scope, all such changes and modifications.

We claim:

1. An integrated power supply and modulator system having an input configured to receive a DC input voltage and having an output configured to supply two or more regulated DC output voltages, the integrated power supply and modulator system comprising:
a switched-capacitor (SC) voltage balancer circuit having a plurality of SC voltage balancer circuit inputs and a plurality of SC voltage balancer circuit outputs, said SC voltage balancer circuit configured to receive charge from a regulated DC input voltage and, in response thereto, maintain a substantially ratiometric set of regulated voltages on a plurality of intermediate voltage nodes with respect to a reference potential, the SC voltage balancer circuit comprising:
a capacitor stack comprising a plurality of capacitors, wherein each of the intermediate voltage nodes is coupled to at least one of the plurality of capacitors,
a first set of switches configured to switch between on and off states in a complimentary fashion with a second set of switches to maintain the substantially ratiometric set of voltages on the plurality of intermediate voltage nodes, and
a set of transfer capacitors configured to transfer charge among the plurality of capacitors of the capacitor stack as the first and second sets of switches are switched.

2. The system of claim 1 further comprising:
a magnetic regulation stage (MRS) having an MRS input corresponding to the integrated power supply and modulator system input and configured to receive the DC input voltage and at least one MRS output configured to provide a regulated DC output voltage with each SC voltage balancer circuit input coupled to a corresponding one of the at least one MRS outputs.

3. The system of claim 2, wherein the MRS further comprises:
an inductor having an input terminal corresponding to the MRS input and having an output terminal; and
a set of switches configured to selectively couple the output terminal of the inductor between the intermediate voltage nodes in the SC voltage balancer circuit and wherein the MRS is configured to provide charge transfer from the MRS input through the inductor to at least one of the plurality of SC voltage balancer circuit inputs and wherein regulation of the SC voltage balancer voltages is obtained by pulse width modulation (PWM) control of the set of switches.

4. The system of claim 3 wherein the SC voltage balancer circuit is provided having k levels and the output of the MRS is connected between the $m^{th}$ level and the $n^{th}$ level of the SC voltage balancer circuit with k>m>n such that k corresponds to a $k^{th}$ intermediate voltage node having the greatest voltage among the intermediate voltage nodes and wherein a voltage at the $k^{th}$ intermediate voltage node $V_k$ is regulated as:

$$V_k = \frac{V_{IN} \cdot k}{n + (m-n)D}$$

where:
$V_{IN}$ is an input voltage applied to the input of the MRS;
k is an integer value corresponding to the $k^{th}$ intermediate voltage node of the SC voltage balancer circuit;
n is an integer value corresponding to the $n^{th}$ intermediate voltage node to which the output of the MRS is connected;
m is an integer value corresponding to the $m^{th}$ intermediate voltage node of the SC voltage balancer circuit to which the output of the MRS is connected; and
D is the duty of a first switch in the set of switches having a terminal connected to the $k^{th}$ intermediate voltage node of the SC voltage balancer circuit.

5. The system of claim 4, wherein the switching frequency of the set of switches in the MRS is different from the switching frequency of the first set of switches in the SC voltage balancer circuit.

6. The system of claim 5, wherein the first and second sets of switches and the set of transfer capacitors are configured as an SC ladder circuit.

7. The system of claim 5, wherein the plurality of intermediate voltage nodes includes a highest-voltage node at a top of the capacitor stack and a lowest-voltage node at a bottom of the capacitor stack.

8. The system of claim 5, wherein: at least one output switching stale (OSS) comprises a plurality of switch sets, each switch set having a corresponding output, wherein each switch set is configured to selectively couple a voltage from a selected one of the voltage nodes of the SC voltage balancer circuit to a corresponding output, wherein the plurality of switch sets includes at least a first switch set and a second switch set that operate independently of one another.

9. The system of claim 4 further comprising:
control circuitry to control the MRS, the SC voltage balancer circuit, and at least one output switching stage (OSS), wherein the control circuitry is configured to control states of switches within the MRS to selectively achieve at least two of boost conversion, buck conversion, and buck/boost conversion within the MRS, wherein the control circuitry is configured to achieve desired voltages on the plurality of intermediate voltage nodes of the SC voltage balancer circuit, in part, by selecting one of boost or buck conversion for the MRS and by setting switching duty cycles for switches of the MRS.

10. The system of claim 2, wherein:
the MRS is configured for both boost and buck regulation; and
the first and the second set of switches and the set of transfer capacitors are configured as an SC ladder circuit.

11. The system of claim 1 further comprising:
at least one output switching stage (OSS) having a plurality of OSS inputs and at least one OSS output configured to provide two or more regulated DC output voltages with each OSS input simultaneously coupled to a corresponding one of the plurality of SC voltage balancer circuit outputs.

12. The system of claim 11, wherein:
the OSS further comprises a plurality of switch sets, each switch set having a corresponding output, wherein each switch set of the plurality of switch sets is configured to selectively couple a voltage from a selected one of the intermediate voltage nodes of the SC voltage balancer circuit to a corresponding output, wherein the plurality of switch sets includes at least a first switch set and a second switch set that operate independently of one another.

13. The system of claim 12 further comprising:
at least one filter coupled to the output of at least one of the plurality of switch sets of the OSS to provide filtration to a corresponding voltage signal.

14. The system of claim 12, wherein the SC voltage balancer circuit is provided having k nodes and k voltage levels and an output of the MRS is connected between the $m^{th}$ node and the $n^{th}$ node of the SC voltage balancer circuit with k>m>n such that k corresponds to a $k^{th}$ intermediate voltage node having the greatest voltage among the intermediate nodes and wherein a voltage at the $k^{th}$ intermediate voltage node Vk is regulated as: Vk=VIN·k/n+(m−n) D where: VIN is an input voltage applied to an input of the MRS; k is an integer value corresponding to the $k^{th}$ intermediate voltage node of the SC voltage balancer circuit; n is an integer value corresponding to the $n^{th}$ intermediate voltage node to which the output of the MRS is connected; m is an integer value corresponding to the $m^{th}$ intermediate voltage node of the SC voltage balancer circuit to which the output of the MRS is connected; and D is the duty of a first switch in the set of switches having a terminal connected to the km intermediate voltage node of the SC voltage balancer circuit; and wherein the switching frequency of the set of switches in the MRS and the switching frequency of the first set of switches in the SC voltage balancer circuit are different from the switching frequency of the switches in the plurality of switch sets in the output switching stage.

15. An integrated power supply and modulator system having an input configured to receive a DC input voltage and having an output configured to supply two or more regulated DC output voltages, the integrated power supply and modulator system comprising: a magnetic regulation stage (MRS) having an input corresponding to the integrated power supply and modulator system input and configured to receive the DC input voltage and a plurality of outputs configured to provide a regulated DC output voltage with each switched-capacitor voltage balancer stage input coupled to a corresponding one of the at least one MRS outputs; the switched-capacitor voltage balancer stage having a plurality of inputs and a plurality of outputs with each input of said switched-capacitor voltage balancer stage coupled to a corresponding one of the plurality of outputs of said magnetic regulation stage; and at least one output switching stage having a plurality of inputs and at least one output with each input of said output switching stage simultaneously coupled to a corresponding one of the plurality of outputs of said switched-capacitor voltage balancer stage, wherein said magnetic regulation stage comprises an inductor and a set of switches, wherein magnetic regulation stage provides charge transfer from the input of the magnetic regulation stage through the inductor to at least one input of the switched-capacitor voltage balancer stage.

16. The integrated power supply and modulator system of claim 15 further comprising at least one or more power amplifier stages, each of the one or more power amplifier stages coupled to each of the at least one outputs of said output switching stage, wherein energy is provided into the system via the magnetic regulation stage and is delivered to each of at least one power amplifier stages via the output switching stage.

17. The integrated power supply and modulator system of claim 15 further comprising precharge circuitry, feedback circuitry and control circuitry wherein:
the precharge circuitry comprises at least one of a linear regulator and a clamp circuit, the precharge circuitry coupled to the switched-capacitor voltage balancer stage and configured to precharge and limit transients to one or more capacitors of the switched-capacitor voltage balancer stage; and
the feedback circuitry is coupled to the control circuitry and at least one of the plurality of outputs of the switched-capacitor voltage balancer stage, the feedback circuitry configured to provide at least one feedback signal to the control circuitry.

18. The integrated power supply and modulator system of claim 17 wherein said control circuitry comprises a pulse width modulation (PWM) circuit which provides pulse width modulation control of said magnetic regulation stage to regulate at least one switched-capacitor voltage balancer stage voltage.

19. The integrated power supply and modulator system of claim 15 wherein said switched-capacitor voltage balancer stage comprises a switched-capacitor (SC) ladder circuit.

20. The integrated power supply and modulator system of claim 19 wherein said switched-capacitor voltage balancer stage comprises:
first and second sets of switches $S_{1A}$, $S_{2A}$, $S_{3A}$, $S_{4A}$, wherein the first set of switches actuates and off together in a complementary fashion with the second set of switches $S_{1B}$, $S_{2B}$, $S_{3B}$, $S_{4B}$;
a set of transfer capacitors $C_{T1}$-$C_{TN}$; and
a set of charge capacitors $C_1$-$C_N$, wherein said transfer capacitors operate to transfer charge among said charge capacitors so as to maintain a desired set of voltage ratios V1:V2:V3:V4.

21. The integrated power supply and modulator system of claim 15 wherein:

said switched-capacitor voltage balancer stage provides one or more capacitor terminal voltages via a set of charge capacitors; and each of said at least one output switching stage dynamically selects from among the one or more capacitor terminal voltages provided in said switched-capacitor voltage balancer stage.

22. The integrated power supply and modulator system of claim 15 wherein semiconductor circuit elements of said magnetic regulation stage, said switched-capacitor voltage balancer stage, and said at least one output switching stage are implemented using a semiconductor process on a single die.

23. The integrated power supply and modulator system of claim 15 wherein semiconductor circuits of said magnetic regulation stage, said switched-capacitor voltage balancer stage, and said at least one output switching stage are provided from a low-voltage CMOS semiconductor process on a single die.

24. An integrated power supply and modulator system having an input configured to receive a DC input voltage and having an output configured to supply, two or more regulated DC output voltages, the integrated power supply and modulator system comprising: a magnetic regulation stage, a multi-output switched-capacitor stage; and an output switching stage wherein: said magnetic regulation stage comprising an inductor and at least two switches, wherein the magnetic regulation stage is configured to draw charge from an input and to provide charge to at least two input terminals of said multi-output switched-capacitor stage, wherein said magnetic regulation stage is configured to provide charge transfer from said input through said inductor to at least one of the at least two input terminals based upon states of the at least two switches; said multi-output switched-capacitor stage is configured to accept charge from said at least two input terminals and redistribute charge to maintain a substantially ratiometric set of voltages between individual capacitor terminals and a reference potential; and said output switching stage comprises at least one switch to select from among at least two voltages of said ratiometric set of voltages of said multi-output switched-capacitor stage for provision to an output.

25. The integrated power supply and modulator of claim 24 wherein said magnetic regulation stage switches among at least two states in order to regulate one or more voltages in the multi-output switched-capacitor stage.

26. The integrated power supply and modulator of claim 25, wherein said output switching stage selects voltages from among the outputs of the multi-output switched-capacitor stage to provide an intermediate modulated voltage.

27. The integrated power supply and modulator of claim 26, further comprising a filter disposed to shape voltage transitions among levels.

28. An integrated power supply and discrete drain modulator system configured to provide a DC bias voltage to a terminal of a radio frequency (RE) power amplifier, the system comprising: a multi-output switched-capacitor voltage balancer having a plurality of inputs; a magnetic regulation stage comprising an inductive element comprising (i) an input configured to receive a DC input voltage, and (ii) an output coupled simultaneously to respective ones of the plurality of inputs of the multi-output switched-capacitor voltage balancer to provide charge transfer from said magnetic regulation stage inputs through the inductor to respective ones of the plurality of inputs of said multi-output switched-capacitor voltage balancer; wherein each input of the multi-output switched-capacitor voltage balancer corresponds to one of a plurality of intermediate modulated voltages of the multi-output switched-capacitor voltage balancer, the multi-output switched-capacitor voltage balancer comprising: a plurality of switches; and a plurality of capacitors, wherein each of the plurality of outputs of the magnetic regulation stage are modulated to maintain the plurality of intermediate modulated voltages as a substantially ratiometric set of regulated DC voltages between individual capacitors of the plurality of capacitors of the multi-output switched-capacitor voltage balancer and a reference potential; and an output switching stage comprising at least one switch and at least one capacitor, the at least one switch configured to select from among at least two voltages of the plurality of intermediate modulated voltages and apply the at least two voltages to the at least one capacitor for provision as at least one modulated DC output voltage, wherein the at least one modulated DC output voltage is provided to the terminal of the RF power amplifier.

\* \* \* \* \*